United States Patent [11] 3,620,847

[72] Inventor Joseph F. Wise
Dayton, Ohio
[21] Appl. No. 821,594
[22] Filed May 5, 1969
[45] Patented Nov. 16, 1971
[73] Assignee The United States of America as represented by the Secretary of the Air Force
Continuation-in-part of application Ser. No. 579,801, Sept. 13, 1966, now abandoned. This application May 5, 1969, Ser. No. 821,594

[54] SILICON SOLAR CELL ARRAY HARDENED TO SPACE NUCLEAR BLAST RADIATION
2 Claims, 9 Drawing Figs.

[52] U.S. Cl. .......... 136/89
[51] Int. Cl. .......... H01l 15/02
[50] Field of Search .......... 136/89

[56] References Cited
UNITED STATES PATENTS

| | | | |
|---|---|---|---|
| 2,984,775 | 5/1961 | Matlow et al. | 136/89 UX |
| 3,284,241 | 11/1966 | Lasser et al. | 136/89 |
| 3,346,419 | 10/1967 | Webb | 136/89 |
| 3,370,986 | 2/1968 | Amsterdam et al. | 136/89 |
| 3,373,321 | 3/1968 | Tarneja et al. | 136/89 UX |
| 3,375,141 | 3/1968 | Julius | 136/89 |
| 3,419,434 | 12/1968 | Colehower | 136/89 |
| 3,449,705 | 6/1969 | Chamberlin | 136/89 X |

*Primary Examiner*—Allen B. Curtis
*Attorneys*—Harry A. Herbert, Jr. and Robert Kern Duncan

ABSTRACT: A silicon solar cell array, having the substrate, the cell-supporting grid structure, the electrical connecting leads, the cell contacts, and the terminal connections all fabricated from low atomic material such as aluminum, beryllium, or magnesium, having glass, silicon oxide and anodized aluminum insulation; silicone adhesives; and having ultrasonic welded electrical connections provides a hardened silicon solar cell array that is relatively impervious to damage from space nuclear blast radiation.

INVENTOR.
JOSEPH F. WISE
BY Henry A. Hebert Jr.
and
Robert Kern Duncan
ATTORNEYS INVENTOR.
JOSEPH F. WISE
BY Harry A. Herbert, Jr.
and
Robert Kern Duncan
ATTORNEYS

SILICON SOLAR CELL ARRAY HARDENED TO SPACE NUCLEAR BLAST RADIATION

CROSS-REFERENCES TO RELATED APPLICATIONS

This application is a continuation-in-part of my earlier application entitled "Silicon Solar Cell," filed Sept. 13, 1966, Ser. No. 579,801, now abandoned.

BACKGROUND OF THE INVENTION

The field of this invention is in the art of solar cells and particularly hardened silicon solar cells that will withstand nuclear blasts in outer space.

At the present time, almost everything that is shot into outer space for operation over an extended period of time has its electrical power supplied by solar cells. It is particularly imperative that military satellites powered by solar cells remain operative, to the greatest extent possible, when a nuclear blast occurs in outer space. Conventional silicon solar cell arrays have been tested (underground) in the presence of a nuclear blast. The failure rate is very high. The failure is due to high temperatures. Conventional solder connections have melted (due primarily as I have discovered to the absorption of X-rays and the cell contacts show evidence throughout of high temperatures.

SUMMARY OF THE INVENTION

I have found that the high temperatures occurring in the prior art silicon solar cell arrays when exposed to nuclear blast are brought about primarily by the reaction of the X-rays and gamma rays on the material used in the construction of the cells and the array. I have further found that materials of higher atomic number act as heat sources when exposed to nuclear radiation. The conventional solder connections, composed of the elements of tin and lead; the conventional silver, copper, beryllium copper, and titanium-silver connectors and contacts all become strong heat sources in the presence of nuclear radiation and cause the silicon solar cell array to heat throughout to destructive temperatures.

While no satellite and its associated solar cell array could withstand a direct hit by a nuclear explosion, this invention of the construction of a solar cell array devoid of high atomic number materials, provides a vastly more reliable power source for satellites that may, in the course of their operation, be subjected to nuclear blasts. The order of magnitude of this improvement is demonstrated by the fact that the cell contact temperature of a conventional array of silicon solar cells having soldered connections rises from an ambient temperature of 50° centigrade to 180° centigrade under a given specific amount of nuclear blast radiation (the solder melts and the cell fails). The cell contact temperature of an array and cell construction as taught herein, under the same nuclear radiation will rise from the same 50° ambient temperature to only 51° centigrade. Expressed another way, the array as taught herein will operate satisfactorily down to one-third the distance from "ground zero" at which conventional arrays fail.

This invention, in addition to generating internally far less heat than conventional arrays when exposed to nuclear blast radiation, will withstand far higher ultimate temperatures before destruction than conventional arrays. The complete array as taught herein will withstand 600° C. instantaneous temperatures and is capable of annealing at 450° C. for a period of 10 hours, or more, for recovery of particulate radiation degradation. The conventional arrays generally fail at approximately 150 ° centigrade.

DESCRIPTION OF THE PREFERRED EMBODIMENT

Figure 1:
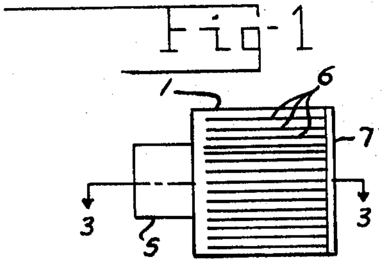
FIG. 1 is a view of an individual silicon solar cell.
Figure 2:
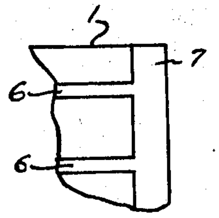
FIG. 2 is an enlarged view of a corner portion of the cell of FIG. 1 showing the top electrical contact.
Figure 3:
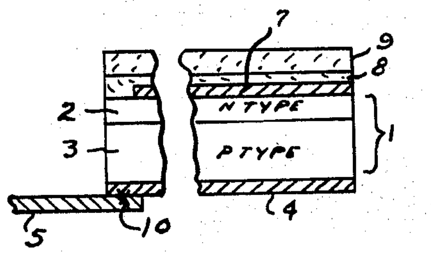
FIG. 3 is an enlarged sectional view of the cell of FIG. 1 taken along section 3—3.
Figure 4:
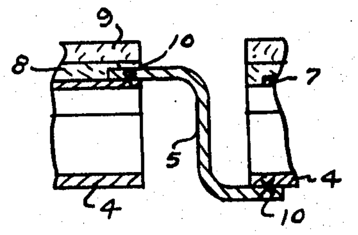
FIG. 4 is a detail view showing the series connection of two cells.

The general construction of silicon solar cells is well known. The advantage of using a unique combination of materials and techniques in the cell and array construction to provide greatly improved operation is the essence of this invention. FIGS. 1, 2, and 3 show the construction of my improved hardened silicon solar cell. FIG. 2 is an enlarged view of the upper left-hand corner of FIG. 1, and FIG. 3 is an enlarged sectional view taken along section 3—3 of FIG. 1. The silicon element 1, is a conventional element composed of N-type material 2 and P-type material 3. While generally N on P cells are preferred, cells of P on N composition may be used. Back contact 4 is a uniform layer or coating of low atomic number electrical conductive material, such as aluminum. Extension tab 5 is for making external electrical connection with the cell contacts. It is necessary that it also be of low atomic number material, such as aluminum, and that it be welded to the cell contacts. Ultrasonic welding is preferred. The top contact is a plurality of comblike fingers 6 extending almost all the way across the top of the silicon element and terminated at the one edge in an integral connecting strip 7. An interference layer 8 such as silicon oxide is deposited over the cell element and top contact and a quartz (silicon dioxide) over layer 9 is integrally deposited overall. Typical dimensions of such cells are 2 centimeters square and ½ millimeter overall thickness.

Typical prior art silicon solar cell and array construction is well exemplified by U.S. Pat. No. 3,346,419, to patentee James E. Webb; U.S. Pat. No. 3,375,141, to patentee R. F. Julius; U.S. Pat. NO. 3,361,594, to patentees P. A. Iles et al. U.S. Pat. No. 2,984,775, to patentees S. L. Matlow et al. and the article "Advanced Solar Cell Power System for Space," by W. R. Cherry and L. W. Slifer published in the "19th Annual Power Sources Conference," Dec. 1965, pages 2–8. These prior art devices generally use silver and gold for cell contacts, conventional soldered connections, copper and nickel conductors, and no limitation is placed on the substrate material.

Figure 5:
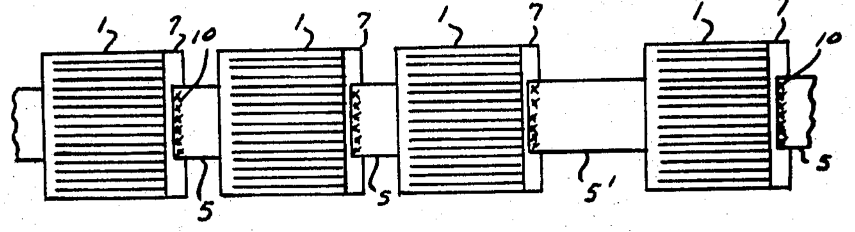
FIG. 5 is a view of the series connection of four cells showing the spacing for the holddown grid.

An improved silicon solar cell array, that has much greater reliability in the presence of nuclear blast radiation, is obtained by constructing the complete array of materials having an atomic number no greater than 14. I have found that the use anyplace in the array of any material of higher atomic number will provide a heat source during a nuclear blast and raise the temperature of the array resulting in the destruction of the solar cell power source. Therefore, in my improved solar cell and array I limit the material for the back and top electrodes 4, 6, and 7 and the tabs 5, to aluminum, beryllium, or magnesium, with aluminum preferred. The interconnecting tab 5 is welded 10 to the back contact 4 and to the top contact 7. Ultrasonic welding is the preferred type of bonding due to the lower heat requirement over conventional welding with less likelihood of damage to the silicon element. FIG. 5 shows a series connection of four silicon solar cells.

Figure 9:
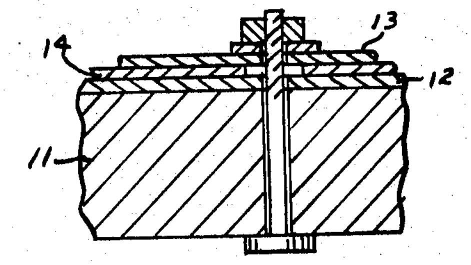
FIG. 9 is an enlarged sectional view taken at 9—9 of FIG. 6 showing the electrical clearance between the parallel electrical connecting strip and the clamping bolt.
Figure 6:
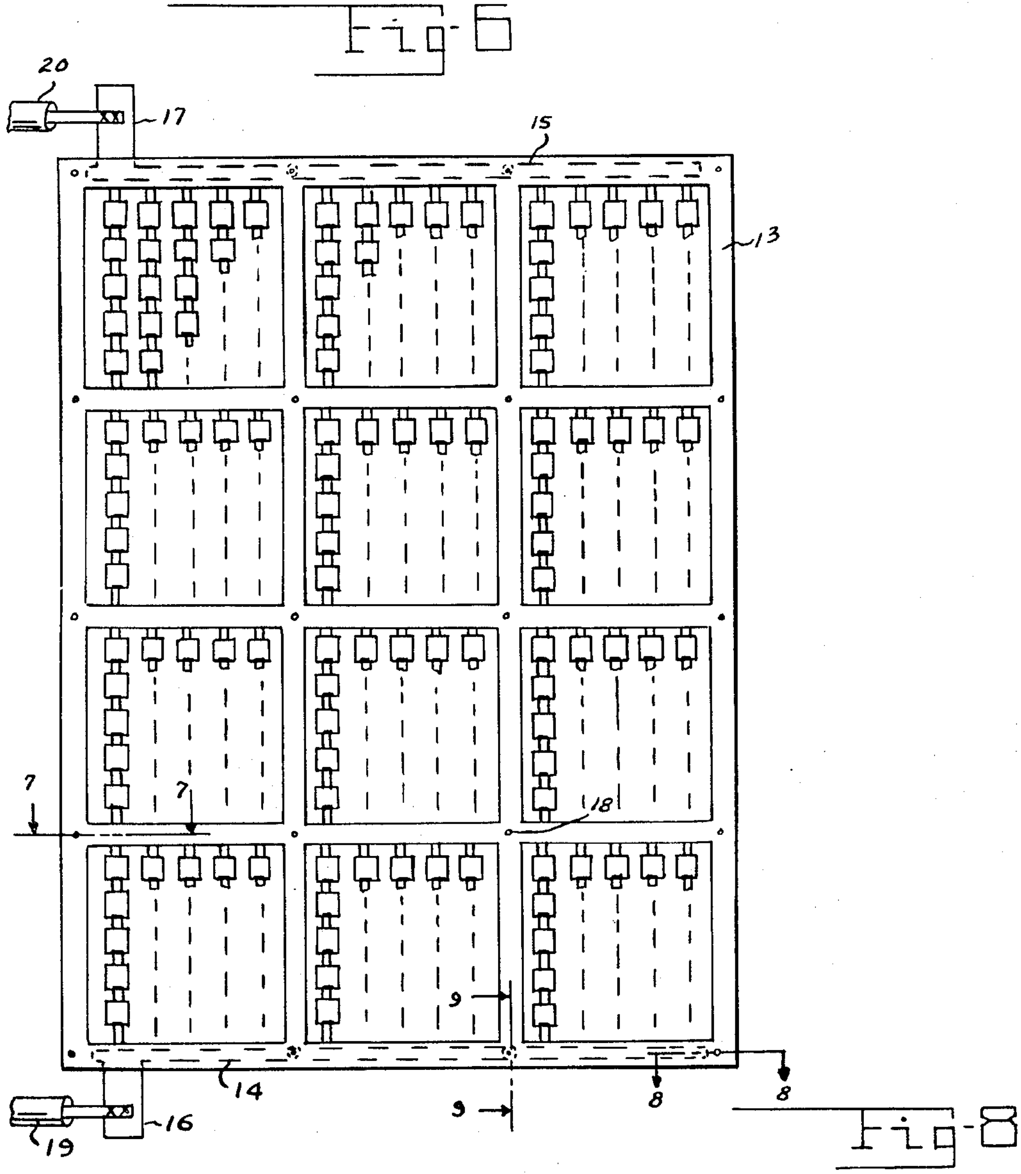
FIG. 6 is a top view of a silicon solar cell array.
Figure 8:
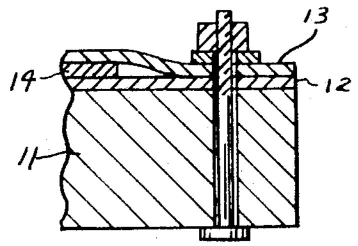
FIG. 8 is an enlarged sectional view taken at 8—8 of FIG. 6 showing the holddown grid over the end of the parallel electrical connecting strip.
Figure 7:
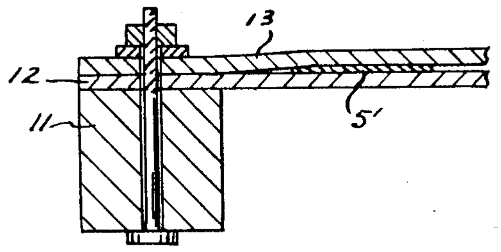
FIG. 7 is an enlarged sectional view taken at 7—7 of FIG. 6 showing the clamping of the substrate and holddown grid.

A solar cell array is composed of a series-parallel arrangement of cells as shown in FIG. 6. It is necessary that the array be constructed exclusively of low atomic number materials. The substrate of the array is a rectangular aluminum frame member covered with a thin sheet of aluminum. This is best shown in the partial sectional views taken of FIG. 6 and shown enlarged in FIGS. 7, 8, and 9. The aluminum frame 11 around the periphery of the array supports the aluminum sheet 12 which in turn supports the cells. An aluminum cover grid 13 is placed on top of the cell assemblies holding them against the substrate. The cover grid 13 passes over the longer connecting tabs between cells as shown 5′ in FIGS. 5 and 7. The ends of the series-connected cells are connected in parallel by ultrasonic welding to aluminum connecting strips 14 and 15 having integral aluminum terminal tabs 16 and 17. Clamping of the cover grid to the substrate is by aluminum bolts, nuts, and washers. The cover grid in addition to being clamped around its periphery to the frame is also bolted 18 to the aluminum substrate at the intersections of the grid, for further holding and supporting the cells. In order to preserve the electrical integrity of the array the frame 11, the aluminum sheet 12, the cover grid 13, and the clamping hardware are all anodized to provide an electrical insulation coverage over the conductive metal. In addition it is desirable to provide clearance around the clamping bolts passing through the aluminum conductor strips 14 and 15, as shown in FIG. 9. Glass cloth may be used instead of aluminum for the cell-supporting members 12 and 13.

To add mechanical strength to the array during the shock of launching and deployment, the individual cells may be cemented to the aluminum sheet substrate. A satisfactory adhesive for this purpose is a silicone rubber adhesive with a silicone resin primer. It is immaterial whether the cement used volatilizes in space or not, as its primary function is support during the launch and deployment. If the particular cement used does not volatilize it should not contain materials that will be a heat source when exposed to nuclear blast radiation, or cause other detrimental effects to the cells. Electrical connections to the array are made through conductors 19 and 20. The aluminum wire of the conductor is welded to the terminal tabs.

Using the cell size previously enumerated, a nominal 100-watt array (28 volts at approximately 4 amperes) has 40 parallel rows of 72 series-connected cells in each row. Of course, any configuration of series-parallel arrangement may be used to provide the power and voltage-current characteristics desired as is well known in the art.

I claim:

1. The improvement in a silicon solar cell array for use in outer space in the presence of nuclear blasts comprising in combination:

a. substrate fabricated from an aluminum frame and anodized aluminum sheet;
b. a plurality of silicon solar cells having aluminum contacts;
c. first aluminum electrical connecting means ultrasonically welded to the said cell contacts providing parallel rows of series-connected cells;
d. adhesive means cementing the said plurality of solar cells to the anodized aluminum sheet for providing support to the cells during launch and deployment;
e. an anodized aluminum cover grid cooperating with the said substrate crossing over a portion of the said electrical connecting means for supporting the electrically connected plurality of solar cells;
f. second aluminum electrical connecting means ultrasonically welded to the first electrical connecting means placing the said parallel rows of series-connected cells in electrical parallel relationship;
g. the said second aluminum electrical connecting means including electrical terminal means for making external electrical connection to the array; and
h. the said solar cell array consisting only of materials composed of elements having atomic numbers no greater than 14

2. The improvement in a solar cell array to provide a hardened solar cell array for use in outer space that will withstand and operate after exposure to nuclear blasts, the said array comprising:

a. a substrate fabricated from a metal having an atomic number less than 14;
b. an insulating material composed of elements having individual atomic numbers not greater than 14 covering the said substrate;
c. a plurality of silicon solar cells each having aluminum contacts, a silicon oxide interference layer, and an integral silicon dioxide cover;
d. means for positioning the said plurality of so cells on the said insulating material covering the substrate;
e. metallic electrical connectors having an atomic number less than 14 welded to the said cell contacts providing an electrical series-parallel arrangement of the plurality of solar cells;
f. a metallic cover grid having an atomic number less than 14 cooperating with the said substrate for supporting the said plurality of solar cells;
g. metallic means having an atomic number less than 14 for making external connection to the said series-parallel arrangement of solar cells; and
h. the said solar cell array containing only materials composed of elements having atomic numbers no greater than 14.

* * * * *